(12) United States Patent
Wang et al.

(10) Patent No.: US 10,372,012 B2
(45) Date of Patent: Aug. 6, 2019

(54) MECHANICAL CHAMELEON THROUGH DYNAMIC REAL-TIME PLASMONIC TUNING

(71) Applicant: WUHAN UNIVERSITY, Wuhan, Hubei (CN)

(72) Inventors: Guoping Wang, Hubei (CN); Sheng Chu, Hubei (CN); Bihong Zhan, Hubei (CN); Sheng Liu, Hubei (CN); Xingxing Yang, Hubei (CN); Qijuan Chen, Hubei (CN)

(73) Assignee: WUHAN UNIVERSITY, Wuhan, Hubei (CN)

( * ) Notice: Subject to any disclaimer, the term of this patent is extended or adjusted under 35 U.S.C. 154(b) by 667 days.

(21) Appl. No.: 15/097,680

(22) Filed: Apr. 13, 2016

(65) Prior Publication Data
US 2017/0139306 A1 May 18, 2017

(30) Foreign Application Priority Data
Nov. 18, 2015 (CN) .......................... 2015 1 0798981

(51) Int. Cl.
| | |
|---|---|
| *G02F 1/25* | (2006.01) |
| *G02F 1/1335* | (2006.01) |
| *G02F 1/23* | (2006.01) |
| *C23C 16/50* | (2006.01) |
| *C23C 26/00* | (2006.01) |

(Continued)

(52) U.S. Cl.
CPC ................ *G02F 1/25* (2013.01); *C23C 16/50* (2013.01); *C23C 26/00* (2013.01); *C25D 3/46* (2013.01); *C25D 7/006* (2013.01); *C25D 11/045* (2013.01); *C25D 17/00* (2013.01); *G02F 1/0121* (2013.01); *G02F 1/133516* (2013.01); *G02F 1/23* (2013.01); *B33Y 10/00* (2014.12); *B33Y 80/00* (2014.12); *B82Y 20/00* (2013.01); *B82Y 40/00* (2013.01); *G02F 2202/16* (2013.01);

(Continued)

(58) Field of Classification Search
None
See application file for complete search history.

(56) References Cited

U.S. PATENT DOCUMENTS

| | | | |
|---|---|---|---|
| 2005/0227063 A1* | 10/2005 | Lawandy | B82Y 20/00 428/323 |
| 2009/0034055 A1* | 2/2009 | Gibson | G02F 1/133516 359/296 |
| 2011/0109956 A1* | 5/2011 | Hashimura | G02F 1/19 359/290 |

* cited by examiner

*Primary Examiner* — Jiong-Ping Lu
(74) *Attorney, Agent, or Firm* — Muncy, Geissler, Olds & Lowe, P.C.

(57) ABSTRACT

A mechanical chameleon through dynamic real-time plasmonic tuning, the external surface of which is covered by plasmonic cells is provided. Plasmonic cells, based on the combination of bimetallic nanodot arrays and electrochemical bias, use the electrochemical method eletrodepositing and stripping Ag shells on plasmonic Au nanodomes and then we achieve the reversible full color plasmonic cells/display. Plasmonic cells, under the control of circuits and sensors, make mechanical chameleon automatically change the color of its own when it's walking to the corresponding background color and always keeping the same color with the color background. This mechanical chameleon through dynamic real-time plasmonic tuning can capture and simulate the entire color-patterns of the environment and then drive the color-changing process in individual cells, fully merging the mechanical chameleon into the surroundings, which makes this technology is readily approachable.

9 Claims, 11 Drawing Sheets (51) Int. Cl.
*C25D 3/46* (2006.01)
*C25D 7/00* (2006.01)
*G02F 1/01* (2006.01)
*C25D 11/04* (2006.01)
*C25D 17/00* (2006.01)
*B33Y 10/00* (2015.01)
*B33Y 80/00* (2015.01)
*B82Y 20/00* (2011.01)
*B82Y 40/00* (2011.01)

(52) U.S. Cl.
CPC ...... *G02F 2202/36* (2013.01); *G02F 2203/10* (2013.01); *G02F 2203/18* (2013.01)

Reddish Colour

MECHANICAL CHAMELEON THROUGH DYNAMIC REAL-TIME PLASMONIC TUNING

CROSS-REFERENCE TO RELATED APPLICATION

This application claims the benefit of China Patent Application No. 201510798981.3, filed on Nov. 28, 2015, in the State Intellectual Property Office of the People's Republic of China, the disclosure of which is incorporated herein in its entirety by reference.

BACKGROUND OF THE INVENTION

1. Field of the Invention

The present invention belongs to the optical invisibility material technical field, which relates to a mechanical chameleon by using dynamic real-time plasmonic tuning.

2. Description of the Related Art

Optical invisibility represents one of the greatest challenges in military and biomimetic research. Despite tremendous efforts, the camouflage methods under study today are mostly derived from pattern painting dated to 1940s. A more sophisticated approach involves the redirection of the incident light to develop an "invisibility cloak" It was only recently that the metamaterials have proved effective in bending electromagnetic waves in the microwave region, but extending to the entire visible spectrum for practical use has been challenging, especially in surroundings that support ballistic light propagation. On the other hand, active camouflage that rapidly adapts the surroundings of an object such as a chameleon could be more feasible to achieve effective invisibility. The key to this biomimetic technology is realizing electrically-driven actuation of broad reflection bands, which may be partially enabled by some of the existing approaches, including electrophoretic, cholesteric liquid crystalline, and electrochromic. The main drawback of these technologies is that they often need color filters or multiple color-mixing layers, thereby resulting insubstantially low reflectivity and more complexed devices. Despite the report of single layered devices such as photonic crystals, their multi-coloration capability is still in their infancy. Nevertheless, their thermal expansion and contraction may severely influence the coloration in an environment with a fluctuating temperature due to the inherent dependence of reflection wavelength on the interparticle separation. It is well known that plasmonic nanostructures can be utilized to drastically tune optical reflection and absorption in the range of ultraviolet-to-near-infrared region. They also have been demonstrated to produce more saturated colors than standard technologies, albeit the difficulty in attaining electrically actuatable colors.

SUMMARY OF THE INVENTION

In order to achieve the above purpose, this invention provides a Mechanical chameleon through dynamic real-time plasmonic tuning.

This invention adopts the following scheme: a mechanical chameleon through dynamic real-time plasmonic tuning, the external surface of mechanical chameleon is covered by plasmonic cells. Its characteristic is that: integrating the plasmonic colour tunability and electrodeposition induced structural transformability, electrodepositing and stripping Ag shells on plasmonic Au nanodomes through electrochemical method, and forming Au-core/Ag-shell nanodomes structure. Plasmonic cells, under the control of circuits and sensors, make mechanical chameleon automatically change the color of its own when it's walking to the corresponding background color and always keeping the same color with the color background.

Preferably, the fabrication process of Au-core/Ag-shell nanodomes structure is that: firstly, an anodized aluminum oxide (AAO) film with highly ordered pores, served as the template for etching a nano-hole array on $SiO_2$, was carefully transferred onto a $SiO_2$ (50 nm)/ITO glass. Then, reactive ion etching (RIE) was performed precisely in order to remove all 50 nm $SiO_2$ film underneath the AAO holes. Finally, the sample was packaged into a device and filled with gel electrolyte containing $Ag^+$ ion.

Preferably, the fabrication process of Au-core/Ag-shell nanodomes structure is also like this: the 3-D print technology can also be used to get highly ordered Au array on the surface of $SiO_2$ (50 nm)/ITO glass; and then the sample was packaged into a device and filled with gel electrolyte containing $Ag^+$ ion.

Preferably, the electrode of Au-core/Ag-shell nanodomes structure was based on standard three-electrode system and 1.5 V voltage difference between two electrodes was used, but still offers good stability and repeatability.

Preferably, plasmonic cells display well modeled in the finite difference time domain (FDTD) simulation part.

Preferably, electrodepositing Ag shells on plasmonic Au nanodomes particles through electrochemical method, the evolution of nanodomes was characterized by a scanning electron microscopy (SEM), a transmission electron microscope (TEM) and an energy dispersive spectroscopy (EDS) mapping.

Preferably, the Au-core/Ag-shell nanostructures were set as hemi-ellipsoids structure.

Preferably, this mechanical chameleon equipped with technically advanced autonomous control systems and a highly-integrated machine vision system can be addressed by using the highly-integrated machine vision system. The acquired information from the machine vision system will be automatically addressed and analyzed by the autonomous control systems and delivered to individual plasmonic cells, which is used to simulate the entire colour-patterns of the environment so as to change the chameleon' body appearance accordingly.

Preferably, the mechanical chameleon was manufactured by using 3-D print technology.

This present invention is based on the combination of bimetallic nanodot arrays and electrochemical bias; we have achieved the reversible full colour plasmonic cells/display by electrochemically controlling the structure of Au/Ag core-shell nanodomes' array and successfully integrated the cells onto a mechanical chameleon, which can blend automatically in coloured backgrounds. Meanwhile, our approach permits real-time light manipulation readily matchable to the color setting in a given environment. The technology can also interface with complex environment and provide a new approach for artificial active-camouflage.

BRIEF DESCRIPTION OF DRAWINGS

a, A schematic diagram of the plasmonic cell. The double layered hemi-ellipsoids represents nanodomes with different Ag shell thickness. b, SEM image of the $SiO_2$ nano-hole array formed after etching and removal of AAO. Scale bar: 100 nm. Inset: A cross-sectional SEM image of one $SiO_2$ nano-hole. Scale bar: 50 nm. c, Top-view SEM image of the Au nanodome-array. Scale bar: 100 nm. d, The formation of the working plasmonic cell including electrodes, gel electrolyte, and sealing. e, Microscopic image of the device's colour in RGB colour. f, Transmission of 600 nm light as a function of electrodeposition voltage. The scan rate: 0.2 V/s. Inset: photo of the plasmonic cell device at the starting and ending point.

FIG. 2 shows a demonstration of the electrically driven colour changing from the device.
a, Reflection spectra of the device after different electrodeposition time. b, The dependence of reflection peak wavelength with different electrodepositing (blue square) and electro-stripping time (orange dot). Insets are photo of the devices corresponding to selected points. c, Chromatic diagram of the plasmonic cell.

FIG. 3 shows a Micro-structural characterizations of the Au/Ag core-shell nanodomes.
a, 45 tilted-view SEM images of the nanodomes array for the sample with electrodeposition time of 0 s, 1.5 s, 3 s, and 4 s. Scale bar: 100 nm. b, TEM image of a single nanodome from samples in a. Scale bar: 20 nm. c, EDS mapping of Au element associated with samples in b. d, EDS mapping of Au element.

FIG. 4 shows a FDTD numerical study of the optical properties of the Au/Ag nanodomes array.
a, Schematic of the simulation and related parameters. b, Two-dimensional reflection spectra as a function of the Ag shell thickness denoted in a. Blueshift with Ag shell increase is evident. c, Simulated electric field distribution for Ag-shell thickness of 0 nm at 650 nm light (left), and Ag shell thickness of 30 nm at 450 nm (right). d, Comparison of reflection spectra: black curve for the Ag (30 nm)/Au core-shell nanodome, and red curve for the pure Au nanodome with same size and shape.

FIG. 5 shows a demonstration of the plasmonic chameleon and display.
a, Schematic of plastic chameleon covered with armor-like plasmonic cells. Ideally, the plasmonic cell body can display colour patterns that mimic the background. b, Top: photo of a real chameleon. Bottom: photo of the plasmonic chameleon on outdoor grass. c, Screen shot of the plasmonic chameleon demonstration movie. The front and back parts of the chameleon are able to change colour independently with respect to their colour backgrounds. d, Left: operational schematic of the "fast display", where all plasmonic cell units are operated simultaneously. Right: screen shot of the display operation movie showing letters of "S"-"Y"-"S". e, Left: operational schematic of the "static display", where the plasmonic cell units are operated line-by-line in matrix-addressing conFIGuration. Middle: image of a school building. Right: photo of the plasmonic cell display to reproduce the building and "W-H-U" letters in a 16×128 pixel geometry.

FIG. 14 shows the dependence of $\varepsilon_1(\lambda)$ on wavelength. The extinction cross section is expressed as:

$$\delta_{abs} = \frac{\omega}{3c}\varepsilon_m^{3/2} V \sum \frac{\left(\frac{1}{P_j^2}\right)\varepsilon_2(\lambda)}{\left\{\varepsilon_1(\lambda) + \left[\frac{1-P_j}{P_j}\right]\varepsilon_m\right\}^2 + \varepsilon_2(\lambda)^2}$$

Here the maximum cross section happens when:

$$\varepsilon_1(\lambda) + \left[\frac{1-P_j}{P_j}\right]\varepsilon_m = 0.$$

Here is the situation: the aspect ratio change will induce the change of $$\left[\frac{1-P_j}{P_j}\right],$$

and then to maintain 0, $\varepsilon_1(\lambda)$ needs to be changed accordingly, leading to the change of peak wavelength.
First of all, the increase of $R_Z$ (deposition of Ag shell) makes $$\rho = \left(1 - \left(\frac{R_X}{R_Z}\right)^2\right)^{1/2}$$

increase, in turn, it makes $$P_X = P_Y = \frac{1 - \frac{1-\rho^2}{2}\left[\frac{1}{2\rho}ln\left(\frac{1+\rho}{1-\rho}\right) - 1\right]}{2}$$

increase. Hence, $$\frac{1-P_X}{2} \text{ and } \frac{1-P_Y}{2}$$

decrease. Finally, in the equation $$\varepsilon_1(\lambda) + \left[\frac{1-P_j}{P_j}\right]\varepsilon_m = 0,$$

$\varepsilon_1(\lambda)$ needs to be increased to maintain 0.
It is obvious that λ will blueshift to make $\varepsilon_1(\lambda)$ increase. In other words, when $R_Z$ increases due to Ag deposition, the extinction cross-section peak blueshifts.

Wherein, w, c, $\varepsilon_m$ and V denote the vacuum light angular frequency, the speed of the light, the surrounding material's dielectric constant, and the volume of the particle, respectively. $P_j$ is the depolarizing factor, including $P_X$, $P_Y$ and $P_Z$. $R_X$, $R_Y$ and $R_Z$ are the axis length.

DETAILED DESCRIPTION OF THE PREFERRED EMBODIMENTS

In order to facilitate common technical staff of the field understanding and implementation of the present invention, combined with the appended drawings and example, there will be a further detailed description for this invention. It should be understood that the described implementation here is only used to show and explain the present invention, not used to limit the invention.

In the invention, we provide a mechanical chameleon through dynamic real-time plasmonic tuning, the external surface of which is covered by plasmonic cells. Plasmonic cells, based on the combination of bimetallic nanodot arrays and electrochemical bias, use the electrochemical method elctrodepositing and stripping Ag shells on plasmonic Au nanodomes. The whole process, the evolution of nanodomes, is characterized by a scanning electron microscopy (SEM), a transmission electron microscope (TEM) and an energy dispersive spectroscopy (EDS) mapping. Au-core/Ag-shell nanodomes structure is formed. The fabrication process of Au-core/Ag-shell nanodomes structure is that: firstly, an anodized aluminum oxide (AAO) film with highly ordered pores in FIG. 5, served as the template for etching a nano-hole array on $SiO_2$, was carefully transferred onto a $SiO_2$ (50 nm)/ITO glass. The contact between them is firm (FIG. 6) for further controllable process. Then, reactive ion etching (RIE) was performed precisely in order to remove all 50 nm $SiO_2$ film underneath the AAO holes. Finally, the sample was packaged into a device and filled with gel electrolyte containing $Ag^+$ ion. Au-core/Ag-shell nanodomes structure. The electrode of Au-core/Ag-shell nanodomes structure was based on standard three-electrode system and 1.5 V voltage difference between two electrodes was used, but still offers good stability and repeatability. Plasmonic cells display well modeled in the finite difference time domain (FDTD) simulation part. Plasmonic cells, under the control of circuits and sensors, make mechanical chameleon automatically change the color of its own when it's walking to the corresponding background color and always keeping the same color with the color background. Mechanical chameleon equipped with technically advanced autonomous control systems and a highly-integrated machine vision system can be addressed by using the highly-integrated machine vision system. The acquired information from the machine vision system will be automatically addressed and analyzed by the autonomous control systems and delivered to individual plasmonic cells, which is used to simulate the entire colour-patterns of the environment so as to change the chameleon' body appearance accordingly.

Figure 1:
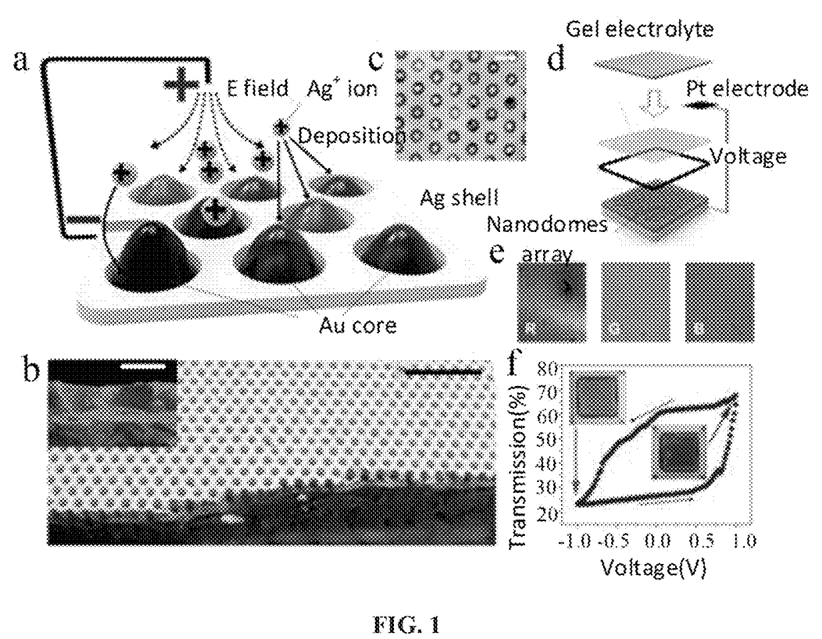
FIG. 1 shows the structure and function of the plasmonic cell devices.
Figure 8:
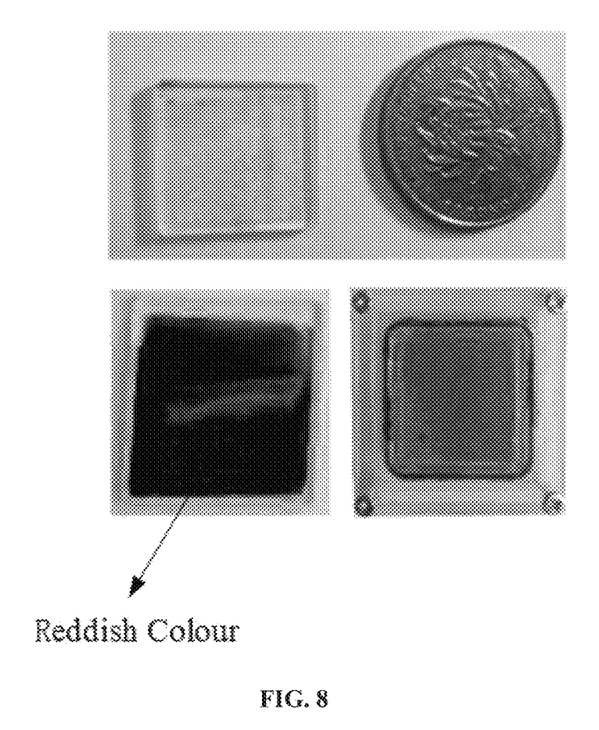
FIG. 8 shows colour of the sample evolving from transparent to red. Top: Photo image of the AAO. Bottom left: $SiO_2$ nano-holes array after deposition of Au nanoparticles, which appears reddish colour. Bottom right: Photo of packaged device.

To ensure outstanding performance of the plasmonic cell, we intentionally designed an Au-core/Ag-shell structure (Schematic FIG. 1a), rather than the reciprocal one, which will be explained in detail in the simulation section. The device fabrication process is described as following: firstly, an anodized aluminum oxide (AAO) film with highly ordered pores, served as the template for etching a nano-hole array on $SiO_2$, was carefully transferred onto a $SiO_2$ (50 nm)/ITO glass. The contact between them is firm for further controllable process. Reactive ion etching (RIE) was then performed precisely in order to remove all 50 nm $SiO_2$ film underneath the AAO holes, while still leaving the 50 nm ITO almost intact. Thus, an ordered array of nano-holes on $SiO_2$ was achieved (FIG. 1b), with a conductive ITO bottom (inset of FIG. 1b). This conductive bottom is important for current feed through in electrodeposition process. Then, the sample was subjected to Au evaporation, creating an ordered array of Au "nanodomes", as shown in the scanning electron microscope (SEM) image of FIG. 1c. The colour of the sample evolves from transparent to red in FIG. 8, which is typically due to plasmonic features of Au nanostructures. Finally, the sample was packaged into the device and filled with gel electrolyte containing $Ag^+$ ion (FIG. 1d).

Figure 9:
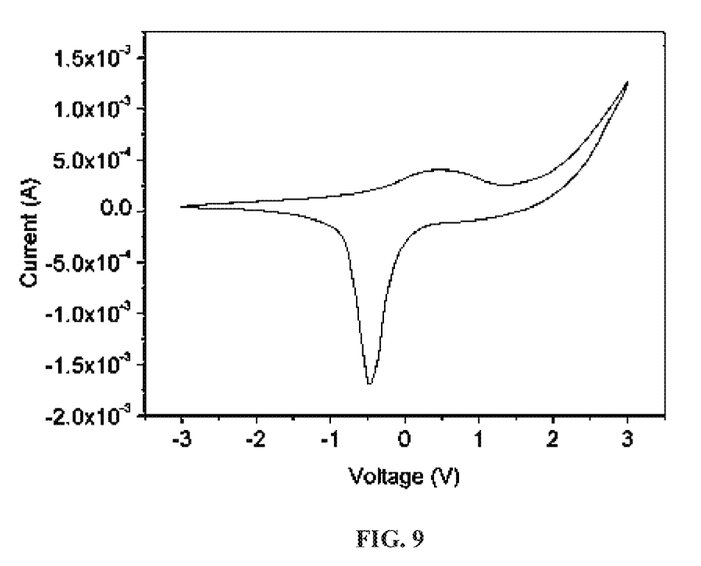
FIG. 9 shows a CV curve of the Au nanodome electrode.

The major merit of the current structure lies in the integration of plasmonic colour tunability and electrodeposition induced structural transformability. Usually, plasmonic nanostructures can induce dramatic change of reflection just by slightly tuning the physical configurations, but nanostructures obtained by normal synthesis only stay stationary, making dynamical plasmonic tenability nearly impossible. Electrodeposition, on the other hand, can dynamically alter material thickness and has been applied in single-colour electrochromic cell, but their potential in controlling plasmonic nanostructures has not been fully explored. Hence, the approach of electrodepositing and stripping Ag shells on plasmonic Au nanodomes can solve the above dilemma and produce reversible plasmonic cell, covering the entire visible spectrum. FIG. 1 is the microscope image of the Au/Ag nanodomes sample, which contains red, green, and blue colours, suggesting fairly wide tunability of the nanodome. For the Au nanodome-electrode, the cyclic voltammogram (CV) based on standard three-electrode system (FIG. 9) presents an obvious reversible redox reaction of Ag and also indicates the viability of rendering a continuous colour change. For working devices, two electrodes are used and 1.5 V voltage difference between two electrodes was used, but still offers good stability and repeatability. The transmission versus oxidation/reduction time is recorded (FIG. 1f) and clearly shows redox behavior, which is well in consistent with the CV measurement. The device displays a broad colour change from red to blue at the initial point and ending point of CV curve (indicated by black arrows), as seen from inset of FIG. 1f.

Figure 2:
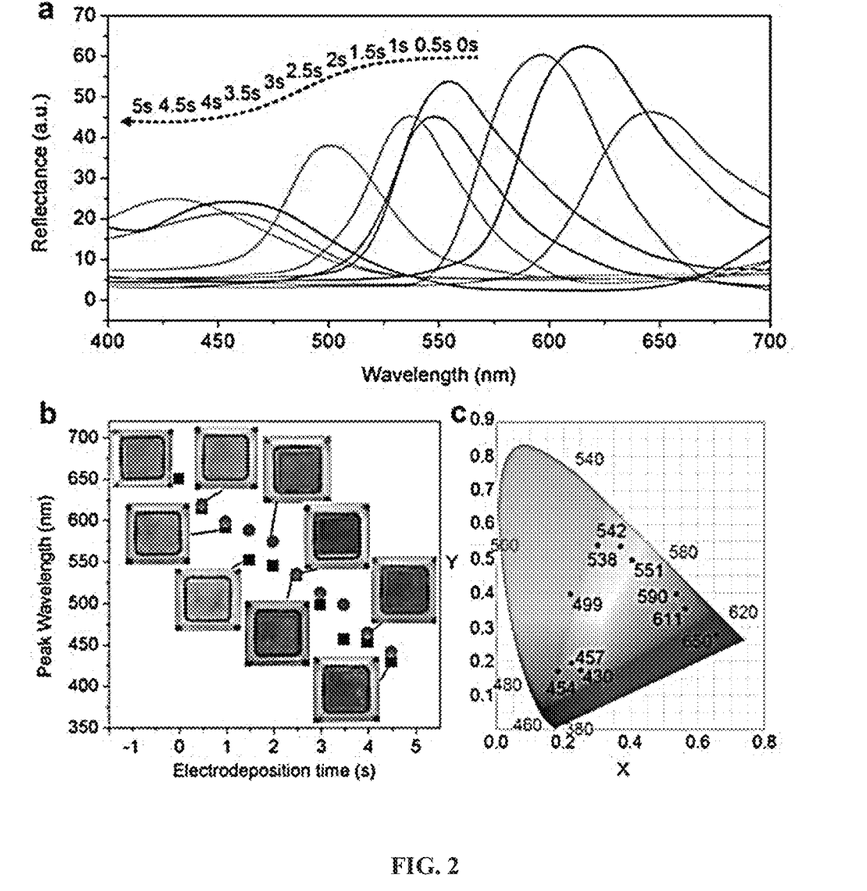
Figure 10:
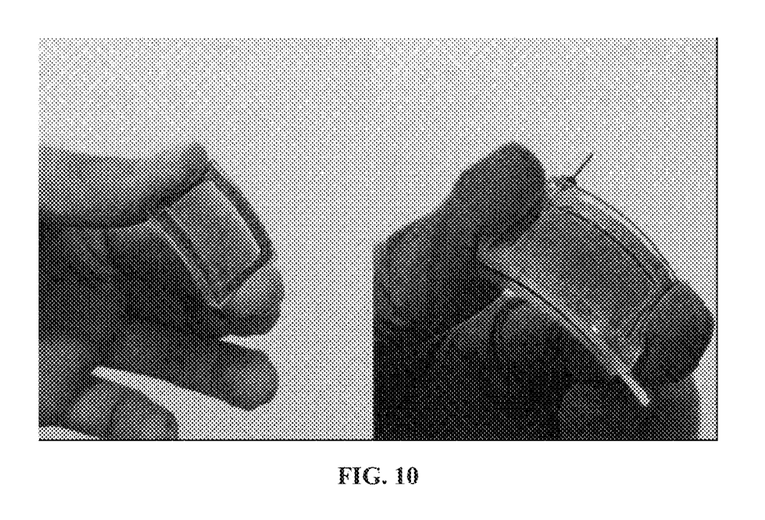
FIG. 10 shows the photos of the flexible EC device before and after IV electrodeposition for 1 s.
Figure 11:
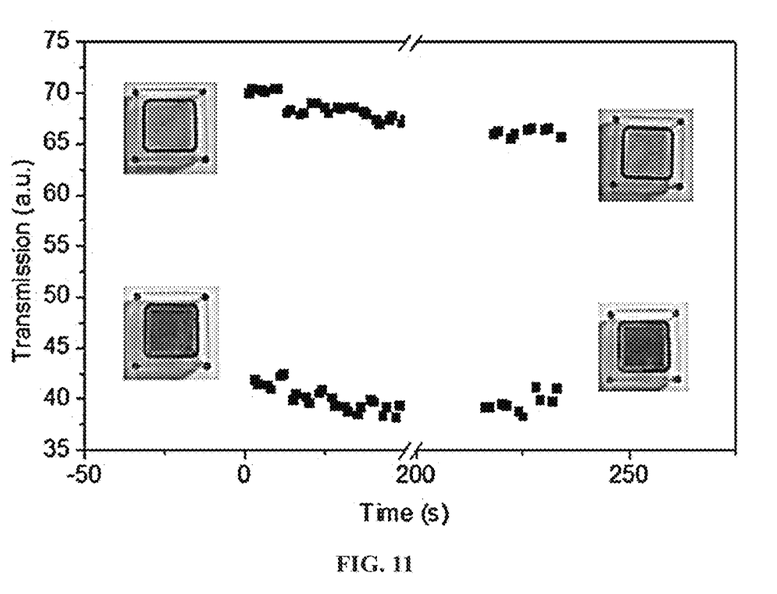
FIG. 11 shows the endurance characteristics of the plasmonic cell device.

FIG. 2a depicts the measured reflection spectra of the device with the increase of Ag deposition time. The trend is monolithic blue-shift with longer Ag deposition time and later well modeled in the finite difference time domain (FDTD) simulation part. FIG. 2b presents the extracted reflection peak positions versus depositing/stripping time, while the superimposed images are corresponding to these selected representative points. FIG. 2c shows the chromatic diagram of the device with points extracted from FIG. 2a. Those results suggest that reversible quasi-full visible colour plasmonic cell is achieved, and capable of jumping between any two colour states within seconds. In addition, the concept of plasmonic cell device is also able to be fabricated on flexible substrates, as shown in FIG. 10 with narrower colour window, implying the potential applications in wearable active-camouflage and functional soft machines, etc. Furthermore, the device is with good stability, which is proved in endurance characterization in FIG. 11. The device did not lose coloration capability after 200 cycles of operation.

Figure 3:
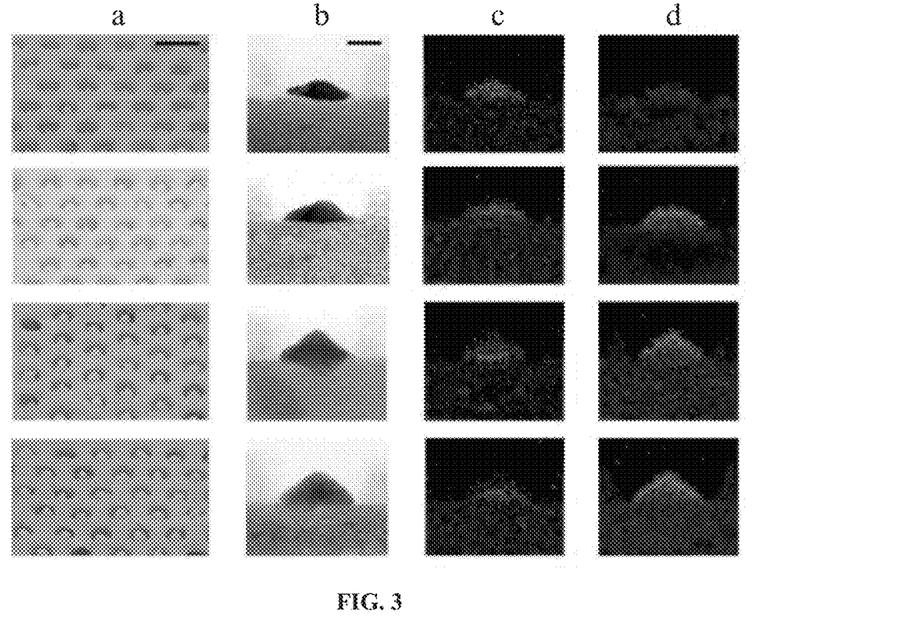
Figure 12:
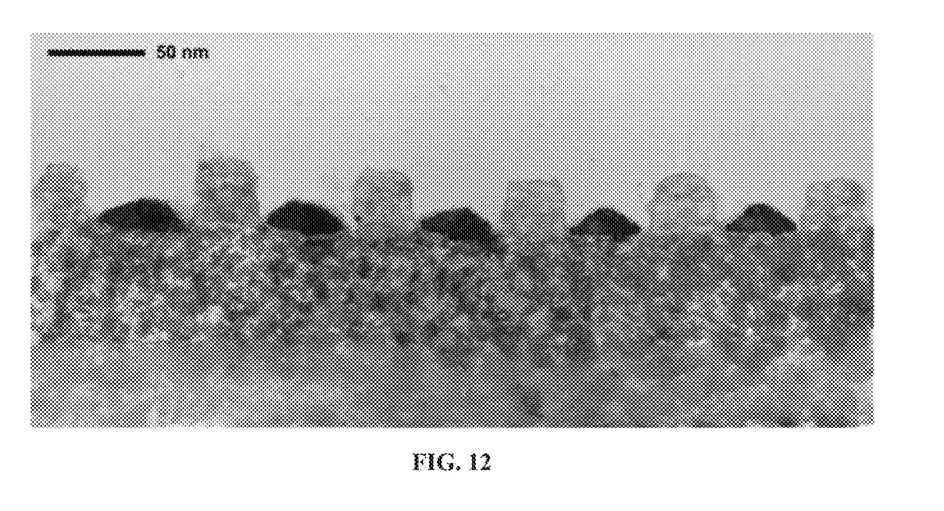
FIG. 12 shows a TEM image of the nanodomes. Scale bar: 100 nm.
Figure 13A:
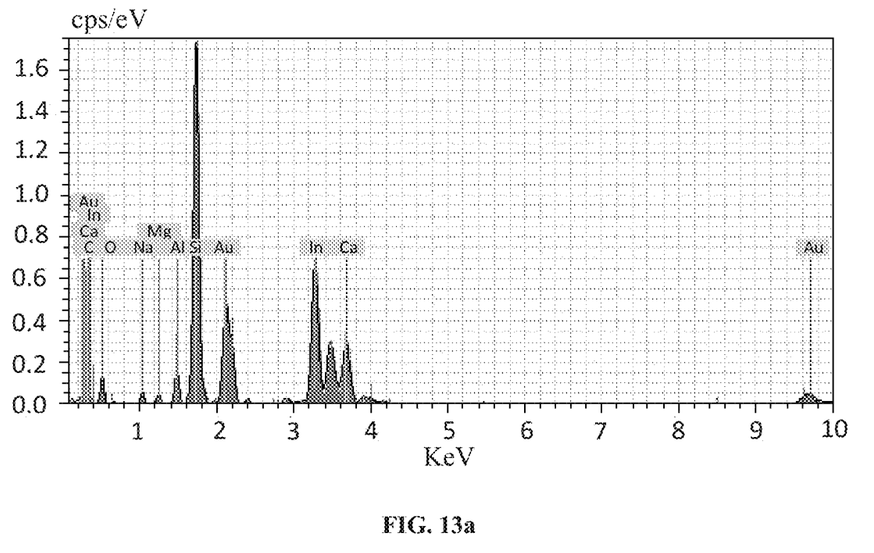
FIGS. 13a-13d show the EDS spectrum of the samples 1, 2, 3 and 4 respectively.
Figure 13B:
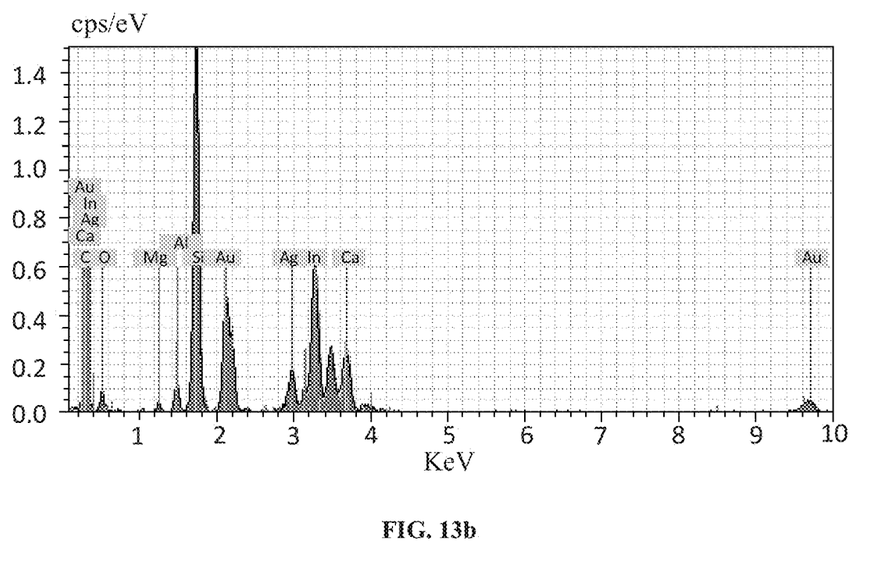
Figure 13C:
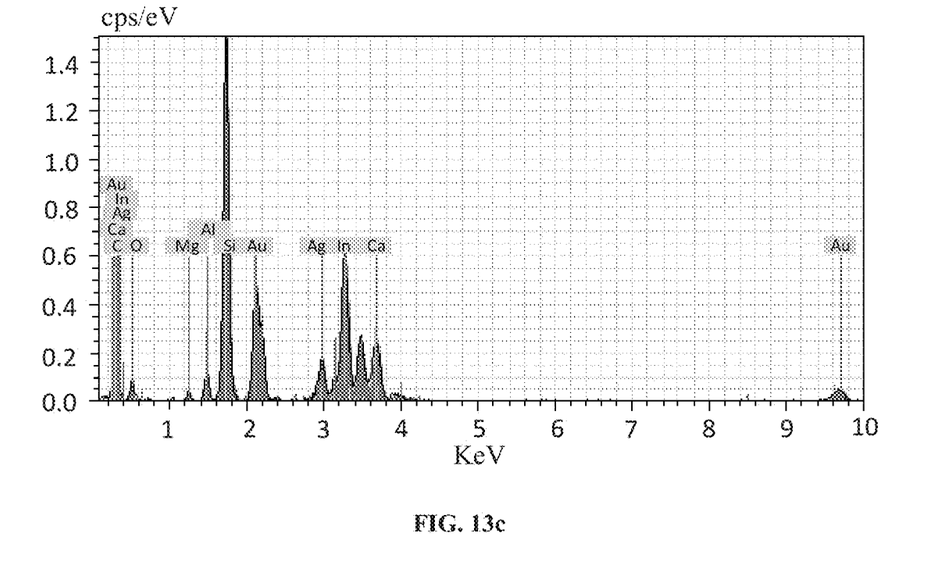
Figure 13D:
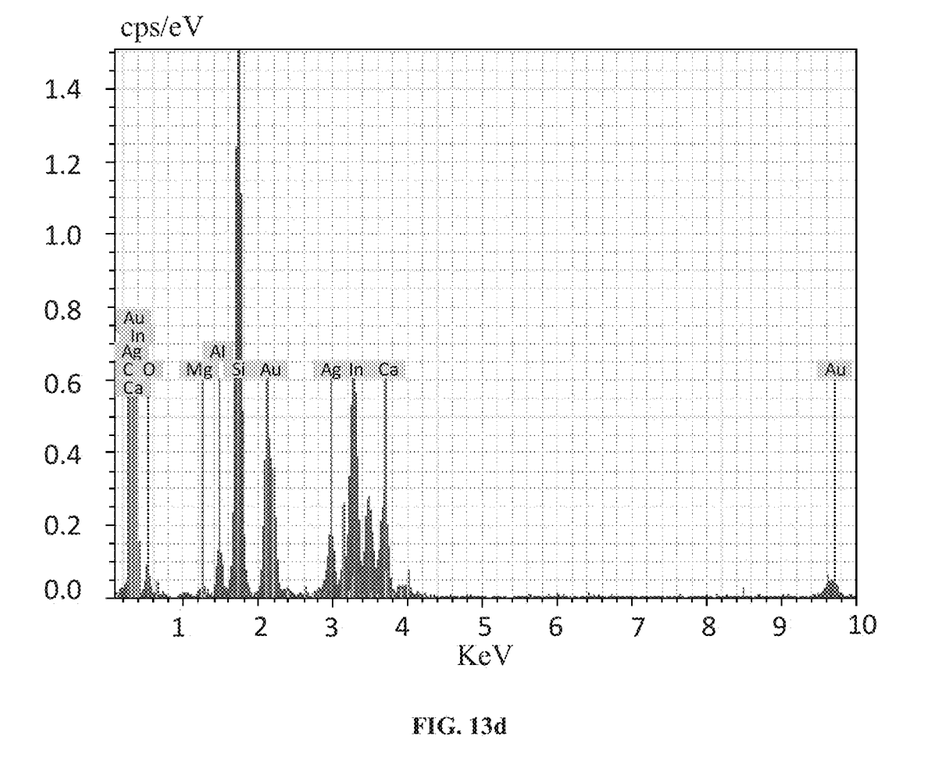

To confirm the successful Ag shell electrodeposition process, the evolution of Nanodomes was characterized by a scanning electron microscopy (SEM), a transmission electron microscope (TEM) and an energy dispersive spectroscopy (EDS) mapping. The SEM images in FIG. 3a clearly present that the size of the nanodomes inside the well-arranged holes was growing larger with longer Ag deposition time (0 s, 1.5 s, 3.5 s and 5 s.), which is in good accordance with the TEM images of the representative single nanodomes for each colour states, as shown in FIG. 3b (lower magnification TEM in FIG. 12), with the measured height of each nanodome of 10 nm, 17, 30 nm, and 40 nm, respectively. EDS mapping coupled in TEM was then used to characterize the locations of Au and Ag elements, which is shown in FIGS. 3c and 3d, with the corresponding EDS spectra given in FIGS. 13a-d, undoubtedly confirming the presence of Au cores and Ag shells in the nanodomes. The above results clearly indicate that a controllable and desirable Ag shell on Au core was achieved by electrodeposition, which strongly suggests that the mechanism of plasmonic cell is due to the formation of Ag/Au hybrid nanostructure, rather than ion insertion or carrier-concentration mediated effect.

Figure 4:
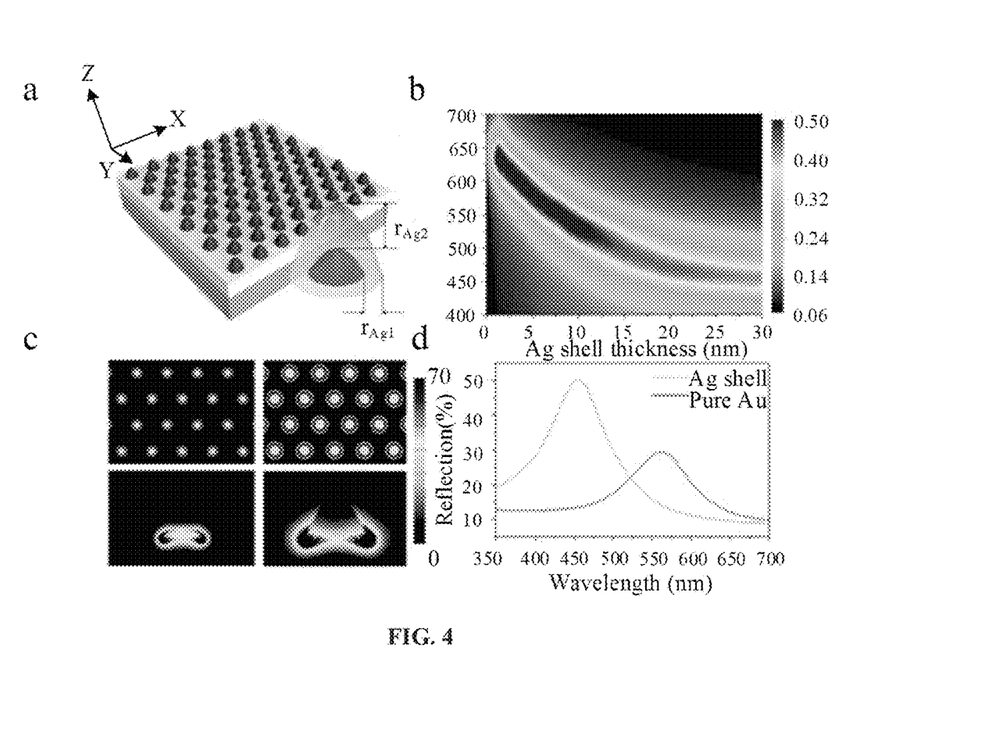

The evolution of reflection dependence on Ag shells was further studied by the FDTD method. The model structure is shown schematically in FIG. 4a. The Au/Ag nanostructures were set as hemi-ellipsoids to reasonably approximate the structure shape observed from experiments. Since in TEM it is observed that the lateral size also slightly increased during the Ag deposition, radii of Au ($r_{Au1}$) and Ag ($r_{Ag1}$) in XY plane are 25 nm and varying in the range of 0-6 nm, respectively. Heights of Au ($r_{Au2}$) and Ag ($r_{Ag2}$) are 10 nm and ranging from 0 to 30 nm on the Z axis, respectively, while the ratio between $r_{Ag2}$ and $r_{Ag1}$ is approximately constant of about 5 during the evolution process, according to TEM results. Here, in our simulation to avoid simulation complexity, the $SiO_2$ layer is not considered since it does not contact with the nanodomes. FIG. 4b shows the two-dimensional reflection pattern for continuously variable thickness of Ag shell, which indicates that the peak wavelength can be continuously tuned from 670 nm to 450 nm, by varying $r_{Ag2}$ from 0 to 30 nm, which well agrees with the experimental range of 650 nm to 430 nm. Strong electric field intensities can be found at the bottom edge of Au/Ag nanodomes in FIG. 4c: with the resonance peak $\lambda$=670 nm when $r_{Ag2}$=0 nm (FIG. 4c left) and $\lambda$=450 nm when $r_{Ag2}$=30 nm (FIG. 4c right), and they are responsible for giving rise to the colours of the sample. From these analyses, it theoretically proves that the electrodeposited shell is responsible for the reflection shift. Even though, whether the shift comes mainly from the Ag material (material factor) or simply the nanodome shape change (geometric factor) still needs to be further distinguished. The magnitude of plasmonic shifting due to pure shape change in hemi-ellipsoid is analyzed as follows. For ellipsoid particles, the absorption cross section can be expressed as:

$$\delta_{abs} = \frac{\omega}{3c} \varepsilon_m^{3/2} V \sum \frac{\left(\frac{1}{P_j^2}\right) \varepsilon_2(\lambda)}{\left\{\varepsilon_1(\lambda) + \left[\frac{1-P_j}{P_j}\right]\varepsilon_m\right\}^2 + \varepsilon_2(\lambda)^2}$$

The depolarizing factor $P_j$ includes $P_X$, $P_Y$ and $P_Z$ corresponding to three axes of the ellipsoid. In the case, axis length $R_Z > R_X = R_Y$, the relationships are:

$$P_Z = \frac{1-\rho^2}{\rho^2}\left[\frac{1}{2\rho} ln\left(\frac{1+\rho}{1-\rho}\right) - 1\right], \quad P_X = P_Y = \frac{1-P_Z}{2}$$

Where: $\rho = (1-(R_X/R_Y)^2)^{1/2}$

Figure 14:
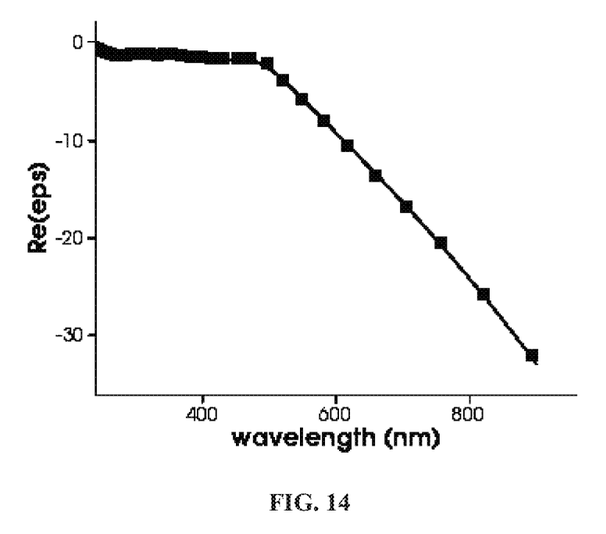

Thus, the change in axis length $R_Z$ and $R_X$ will lead to the shift of extinction spectra. In fact, a detailed derivation (see FIG. 14 and corresponding analysis) shows that when the ratio of $R_Z/R_X$ increases ($R_Z$, $R_X$ are corresponding to $r_{Ag2}+r_{Au2}$, $r_{Ag1}+r_{Au1}$ in our experiment, respectively. $R_Z/R_X$ indeed increase with Ag deposition), the resonant peak in XY plane (in the normal incidence case) blueshifts, which is the same direction of adding shorter plasmonic wavelength Ag into Au, indicating that the geometric factor is a positive enhancement role considerably helping achieve a wide tuning range of 670 nm to 450 nm. In order to verify this conclusion on geometric factor induced shift, another simulation of "Au-shell" on original Au-core is carried out in FIG. 4d. The comparison of reflection spectra between 30 nm Ag-shell and 30 nm "Au-shell" on the same original Au-core blueshift to 450 nm and 560 nm, respectively, from the same 670 nm peak of the original Au-core. This clearly suggests that only by coupling of both geometric factor and material (Ag shell) factor, the capability of tuning-wavelength down to blue region is then able to be realized. Moreover, if the geometric factor related peak-shift direction contradicts the shift-trend induced by material itself, then the overall colour tunability will be compromised. Specifically, if the Ag-core/Au-shell rather than Au-core/Ag-shell is considered, it can be well predicted that: the deposition of Au-shell on Ag-core will redshift the peak wavelength due to intrinsic plasmonic spectral properties of Au, but the geometric factor ($R_Z/R_X$) will lead to the blueshift as mentioned above to compensate Au induced redshift. Therefore, this would be a severe constraint for accomplishing full visible colour performance. Thus, the design of Au-core/Ag-shell is a logical choice for the artificial active-camouflage application.

Figure 5:
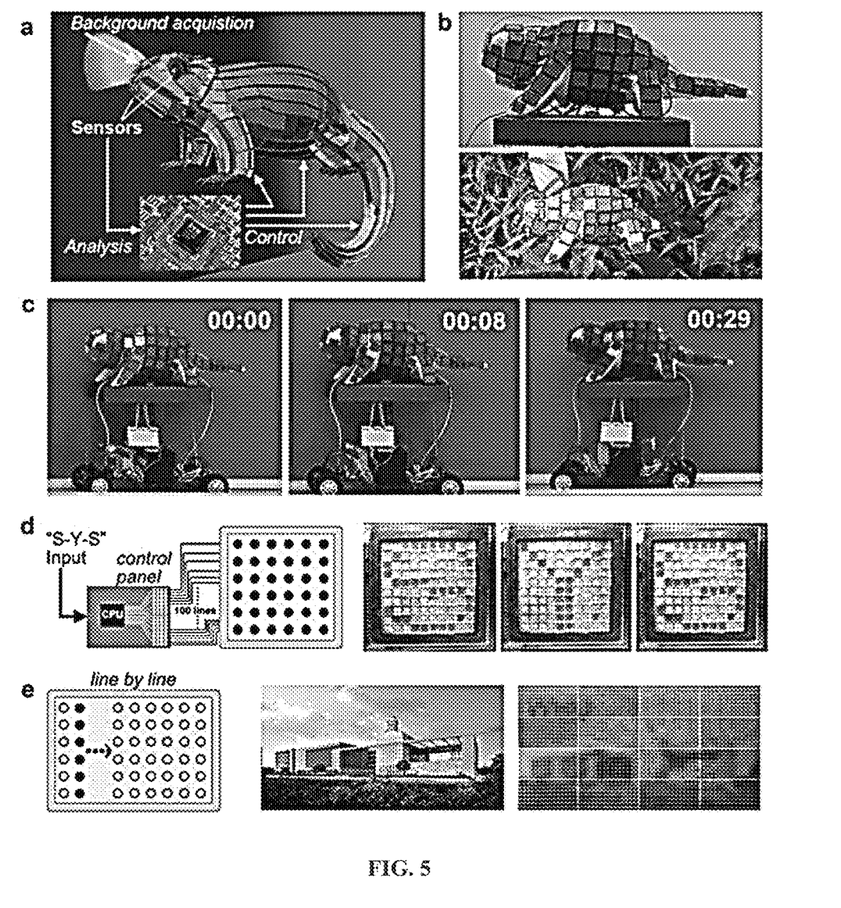
Figure 6:
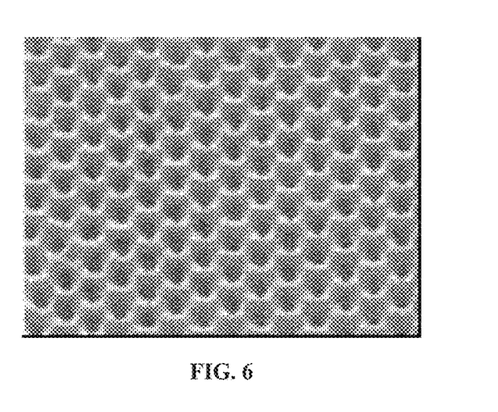
FIG. 6 shows a SEM image of AAO used for etching template. Scale bar: 100 nm.
Figure 7:
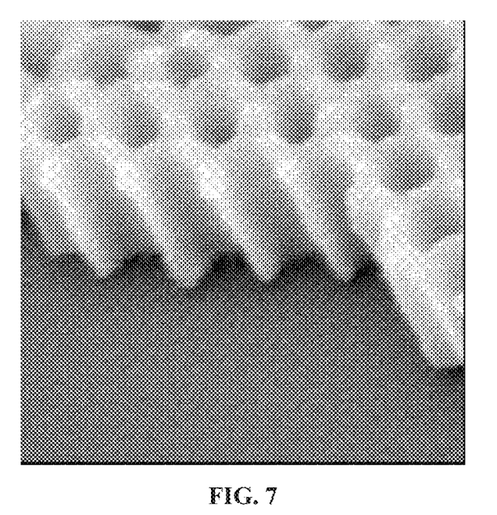
FIG. 7 shows a SEM image of AAO and $SiO_2$ interface. Scale bar: 100 nm.
Figure 15:
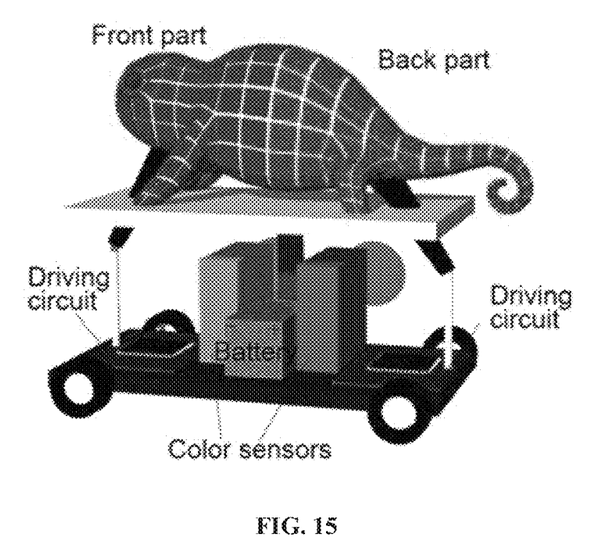
FIG. 15 shows a structure of the automatic mechanic chameleon
Figure 16:
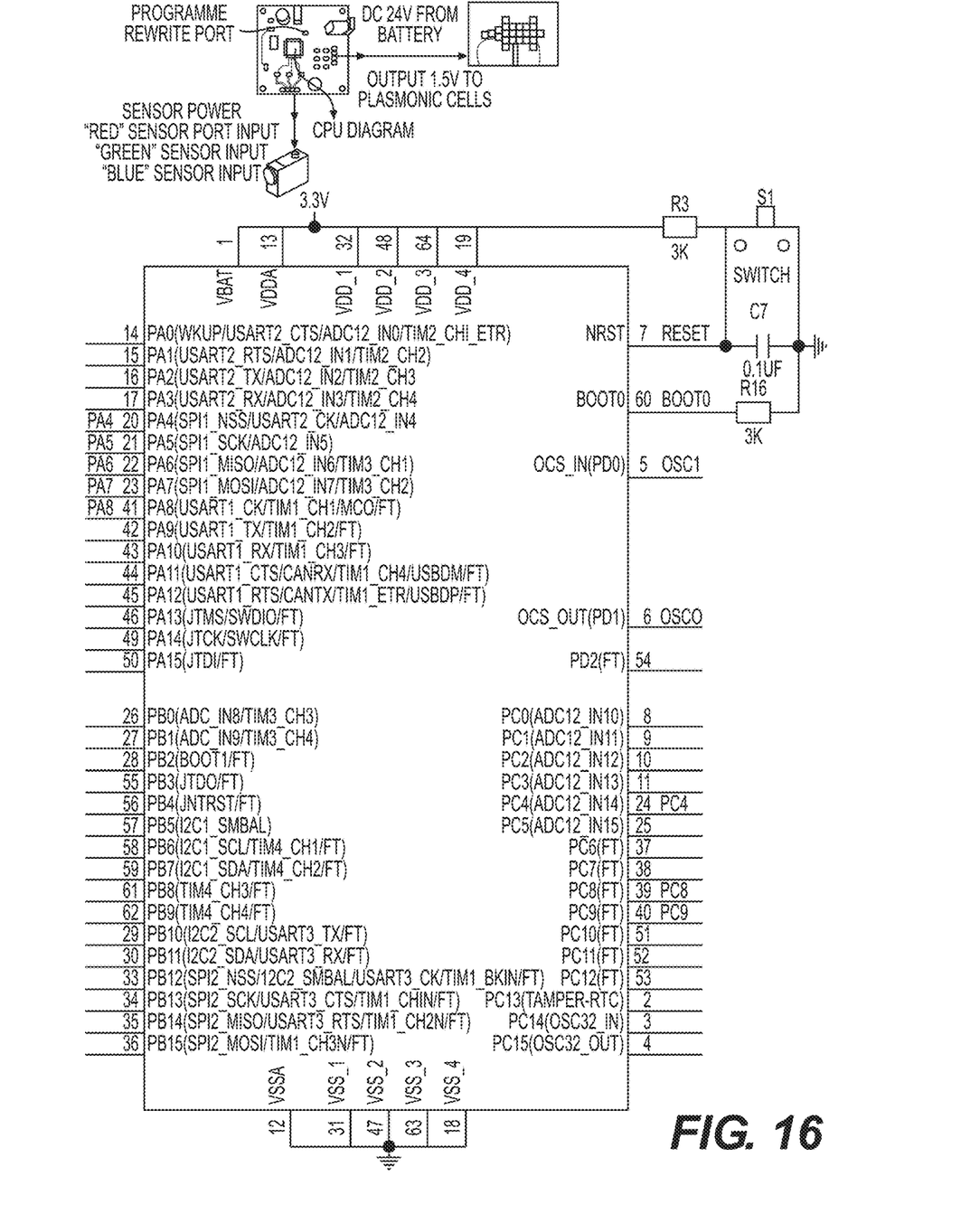
FIG. 16 shows the operational mechanism and circuit diagram of the main control circuits.

Having the excellent ability of plasmonic cells, many profound applications can be implemented. Here, we focus firstly on the biomimetic active-camouflage embodied in a mechanical chameleon. FIG. 5a shows the schematic of the mechanical chameleon with the working principle. The whole body of the chameleon is covered with fish-scale like colour patches, which corresponds to plasmonic cells in our experiment. An ideal mechanical chameleon will be equipped with miniature colour sensors to sense the colour patterns of the environment. The acquired information from camera will be automatically analyzed and delivered to individual colour patches, changing the chameleon' body appearance accordingly. The demonstration used mechanical chameleon's structure is shown in FIG. 15, in with two simplified colour sensors are used, corresponding to the front and rear part of the concept-proven mechanical chameleon following respectively with an independent home-made micro-control system (FIG. 16). Sensors are capable of detecting the red, green and blue, one at a time and output the voltage-signals into the micro-control system, which can analyze signals and subsequently apply a voltage of 1.5V onto the corresponding plasmonic cells with suitable time duration, presenting the colours matching the background. The top and bottom of FIG. 5b show the picture of a real chameleon and the colour-patterns of our mechanical chameleon in the natural environment, respectively. FIG. 5c shows the screenshots of our movie, displaying the walking chameleon of corresponding time in front of a triple-colour background. The colours of $2^{nd}$ second (red), $11^{th}$ (red and green) and $60^{th}$ second (blue) are shown in the left, middle and right panel, respectively. As we can see from the FIG. 5c, when the mechanical chameleon is moving from red background to the green one, the colour of plasmonic cells in the front part will switch to green automatically, merging into the background, but the rear part is still in the red background, with no colour-switching until its sensor moved to green background. The colour-changing effect can also be duplicated in the interface of green/blue. Evidently, the mechanical chameleon possesses every fundamental feature that needed for realistic active camouflage.

As a side product, we demonstrate the potential capability of displaying of plasmonic cells, which can be used in low-powered electronic papers and display units. FIG. 5d is a 10×10 "fast" display screen that the total refresh speed (<1 s) is equal to the responsive speed of one plasmonic cell, since all 100 cells are operated simultaneously (FIG. 5d left schematic). The driving circuit for the plasmonic display is given in FIGS. S12-S13. FIG. 5d right shows "S"-"Y"-"S" letters produced from the dynamic screen. For the potential application in higher resolution graphic display, a static 64×32 image containing letters "W-H-U" and a school building are presented in FIG. 5e. It should be noted that the whole image of the building is done by integrating 16 different individual pictures produced from 128 plasmonic cells using line-by-line matrix addressing technique. This shows the promise to display higher resolution (for example 1024×768) images if fabrication process is further advanced, nevertheless, plasmonic cells might perform insufficiently if used for video displays due to their responding rate.

In conclusion, we have achieved the reversible full colour plasmonic cells/display by electrochemically controlling the structure of Au/Ag core-shell nanodomes' array and successfully integrated the cells onto a mechanical chameleon, which can blend automatically in coloured backgrounds. Although the current mechanical chameleon can perform in backgrounds only have three primary colours (red, green and blue), our technology can also interface with complex environment and provide a new approach for artificial active-camouflage. This application is readily approachable by using more technically advanced autonomous systems, which can be addressed by using highly-integrated machine vision system that can capture and simulate the entire colour-patterns of the environment and then drive the colour-changing process in individual cells, fully merging the mechanical chameleon into the surroundings, which makes this technology is readily approachable.

In this invention, dynamic plasmonic-nanostructures based on highly ordered Au/Ag nanodomes are integrated into our design and successfully demonstrate a biomimetic mechanical "chameleon" as well as a 16×128 "palsmonic cell"-matrix display, effective in a full visible region of 430 nm to 650 nm, which is operated by altering the Au/Ag core shell structures through electrodepositing/stripping process.

The fabrication and preparation of palsmonic in the implementation: The rectangle-shaped AAO membranes on Al foil having the sizes ranging from 2 mm×2 mm to 2 cm×2 cm were purchased from Shangmu Technologies Ltd., with arrays of pores of 50 nm diameter and 100 nm spacing. $SiO_2$ film with thickness of 50 nm was deposited on ITO glass using a plasma-enhanced chemical vapor deposition method. The AAO film was transferred onto the $SiO_2$ in liquid environment. The etching of $SiO_2$ film was performed in our Oxford PlasmaPro 100 system with inductive power of 400 W and etching rate of 50 nm/min. Au deposition was then done using a homemade thermal evaporator, where the Au deposition rate is around 1 nm/min.

The fabrication and preparation of palsmonic device and mechanical chameleon in the implementation: Device was packaged in custom-made glass holders. The holders, hosting the ITO/$SiO_2$ substrates of the plasmonic cells with electric wires feeding in, were filled with gel electrolyte. The gel electrolyte was composed of 1 mol/L $AgNO_3$ as the source of $Ag^+$ ion, 2.5 mol/L LiBr as the supporting electrolyte, and 0.1 mol/L $CuCl_2$ as the electrochemical mediator in Dimethyl sulfoxid (DMSO). Subsequently, Polyvinyl butyral (PVB) as the host polymer was added into the above solution with its final weight-percentage of 10%. The mechanical chameleon made of Acrylonitrile butadiene styrene (ABS) was 3D-printed using Da Vinci 1.0 printer (XYZ Printing), and subsequently, conformally covered with the plasmonic cells prepared above.

The equipment which is used to describe the characteristic of palsmonic device and mechanical chameleon in the implementation: The SEM images were obtained using a JEOL 6380 system. The TEM images were taken under a FEI Tecnai G2 Spirit system equipped with EDS mapping capability. The UV-Vis-NIR absorption/reflection spectra were recorded with an ultraviolet-visible-infrared spectrophotometer (Lamda 950).

Electrochemistry characterization of palsmonic device in the implementation: The CV curve of the device was done by an electrochemical analyzer (Shanghai Chen Hua CHI 600E). The scan speed in CV curve is set as 1 V/s.

FDTD simulation in the implementation: FDTD Solution 8.5 (Lumerical Inc.) was used for the simulation. The wavelength-dependent refractive indices of Au, Ag and $SiO_2$ are extracted from ref. 29, and ref. 30, respectively. The refractive index of the surrounding matrix is 1. Periodic boundary conditions are applied on X and Y directions, with respect to Z direction, perfectly-matched layer boundary conditions are used. Circularly polarized light with wavelength range of 400-700 nm propagating along the Z direction is coming from the above of the hemi-ellipsoids. A frequency domain power monitor was used to record the emission profile over the simulation region.

It should be understood that the parts which are not expounded detailedly are belong to existing technologies in this instruction.

It should be understood that the above description for better implementation of case is very detailed. Therefore, it is not considered a limit to the scope of invention patent protection. In the light of the present invention, ordinary technical personnel of the field still can make a replacement or deformation in not out of the range of the present invention claims protection case, all of these fall into the protection scope of the present invention, the request protection scope of the invention on the basis of the claim.

What is claimed is:

1. A mechanical chameleon through dynamic real-time plasmonic tuning, the external surface of mechanical chameleon is covered by plasmonic cells, the plasmonic cells integrating plasmonic color tunability and electrodeposition induced structural transformability; the fabrication process of the plasmonic cells comprising: electrodepositing and stripping Ag shells on plasmonic Au nanodomes through electrochemical method; and forming Au-core/Ag-shell nanodomes structure; the plasmonic cells, under the control of circuits and sensors, make mechanical chameleon automatically change the color of its own when it's walking to a background with a different color and always keeping the same color as the background.

2. The mechanical chameleon through dynamic real-time plasmonic tuning of claim 1, wherein: the fabrication process of Au-core/Ag-shell nanodomes structure comprises: firstly, an anodized aluminum oxide (AAO) film with highly ordered pores, serves as the template for etching a nano-hole array on $SiO_2$, is transferred onto a $SiO_2$ film with a thickness of 50 nm on ITO glass; then, reactive ion etching (RIE) is performed in order to remove all 50 nm $SiO_2$ film underneath the AAO holes; and finally, the sample is packaged into a device and filled with gel electrolyte containing Ag+ion.

3. The mechanical chameleon through dynamic real-time plasmonic tuning of claim 1, wherein: the fabrication process of Au-core/Ag-shell nanodomes structure comprises: the 3-D print technology is used to get highly ordered Au array on the surface of $SiO_2$ film with a thickness of 50 nm on ITO glass; and then the sample is packaged into a device and filled with gel electrolyte containing $Ag^+$ion.

4. The mechanical chameleon through dynamic real-time plasmonic tuning of claim 1, wherein: the electrode of Au-core/Ag-shell nanodomes structure is based on standard three-electrode system and 1.5 V voltage difference between two electrodes is used, but still offers good stability and repeatability.

5. The mechanical chameleon through dynamic real-time plasmonic tuning of claim 1, wherein: the plasmonic cells display is modeled in the finite difference time domain (FDTD) simulation part.

6. The mechanical chameleon through dynamic real-time plasmonic tuning of claim 1, comprising: electrodepositing the Ag shells on plasmonic Au nanodomes particles through electrochemical method, the evolution of nanodomes is characterized by a scanning electron microscopy (SEM), a transmission electron microscope (TEM) and an energy dispersive spectroscopy (EDS) mapping.

7. The mechanical chameleon through dynamic real-time plasmonic tuning of claim 1, wherein: the Au-core/Ag-shell nanostructures are set as hemi-ellipsoids structure.

8. The mechanical chameleon through dynamic real-time plasmonic tuning of claim 1, wherein: the mechanical chameleon equipped with autonomous control systems and a machine vision system is addressed by using the machine vision system, and acquired information from the machine vision system is automatically addressed and analyzed by the autonomous control systems and delivered to individual plasmonic cells, which is used to simulate the entire color-patterns of the environment so as to change the chameleon's body appearance accordingly.

9. The mechanical chameleon through dynamic real-time plasmonic tuning of claim 1, wherein: the mechanical chameleon is manufactured by using 3-D print technology.

* * * * *